United States Patent
Cheng et al.

(10) Patent No.: US 11,546,088 B2
(45) Date of Patent: Jan. 3, 2023

(54) CHECK CODE PROCESSING METHOD, ELECTRONIC DEVICE AND STORAGE MEDIUM

(71) Applicants: CHINA MOBILE COMMUNICATION CO., LTD RESEARCH INSTITUTE, Beijing (CN); CHINA MOBILE COMMUNICATIONS GROUP CO., LTD., Beijing (CN)

(72) Inventors: Weiqiang Cheng, Beijing (CN); Han Li, Beijing (CN); Lei Wang, Beijing (CN)

(73) Assignees: CHINA MOBILE COMMUNICATION CO., LTD RESEARCH INSTITUTE, Beijing (CN); CHINA MOBILE COMMUNICATIONS GROUP CO., LTD., Beijing (CN)

( * ) Notice: Subject to any disclaimer, the term of this patent is extended or adjusted under 35 U.S.C. 154(b) by 31 days.

(21) Appl. No.: 16/649,010

(22) PCT Filed: Aug. 15, 2018

(86) PCT No.: PCT/CN2018/100713
§ 371 (c)(1),
(2) Date: Mar. 19, 2020

(87) PCT Pub. No.: WO2019/056895
PCT Pub. Date: Mar. 28, 2019

(65) Prior Publication Data
US 2020/0295874 A1    Sep. 17, 2020

(30) Foreign Application Priority Data
Sep. 21, 2017   (CN) .......................... 201710861866.5

(51) Int. Cl.
*H04L 1/00*  (2006.01)
*H04L 1/20*  (2006.01)
(Continued)

(52) U.S. Cl.
CPC .............. *H04L 1/0061* (2013.01); *H04L 1/20* (2013.01); *H04L 7/048* (2013.01); *H04L 47/28* (2013.01)

(58) Field of Classification Search
CPC . H04L 1/00; H04L 1/0061; H04L 1/20; H04L 47/28; H04L 7/048; H04L 1/0057; H04L 1/0065; H03M 13/09
See application file for complete search history.

(56) References Cited

U.S. PATENT DOCUMENTS

| 8,419,547 B1 | 4/2013 | Radek |
| 2001/0015844 A1* | 8/2001 | Takehana .................. H04L 1/20 398/178 |

(Continued)

FOREIGN PATENT DOCUMENTS

| CN | 1913531 A | 2/2007 |
| CN | 101312384 A | 11/2008 |

(Continued)

OTHER PUBLICATIONS

International Search Report in the international application No. PCT/CN2018/100713, dated Nov. 5, 2018.
(Continued)

*Primary Examiner* — Derrick V Rose
(74) *Attorney, Agent, or Firm* — BakerHostetler

(57) ABSTRACT

Disclosed in embodiments of this disclosure are a check code processing method, an electronic device and a storage medium. The check code processing method comprising: performing operations on m bits of the $n^{th}$ byte of a code block to obtain the $n^{th}$ bit of a first sequence; and performing
(Continued)

operation on the first sequence of the code block with a same transmission period to obtain a check code.

20 Claims, 11 Drawing Sheets

(51) Int. Cl.
*H04L 12/841* (2013.01)
*H04L 7/04* (2006.01)
*H04L 47/28* (2022.01)

(56) References Cited

U.S. PATENT DOCUMENTS

| | | | |
|---|---|---|---|
| 2008/0134003 A1 | 6/2008 | Chun | |
| 2010/0005364 A1 | 1/2010 | Higurashi et al. | |
| 2020/0091932 A1* | 3/2020 | Zhang | G06F 11/102 |
| 2020/0153720 A1* | 5/2020 | Zhang | H04L 43/0829 |

FOREIGN PATENT DOCUMENTS

| | | |
|---|---|---|
| CN | 101325468 A | 12/2008 |
| CN | 104065447 A | 9/2014 |
| CN | 104471888 A | 3/2015 |
| CN | 105721232 A | 6/2016 |
| CN | 106685591 A | 5/2017 |
| EP | 2141816 A1 | 1/2010 |
| EP | 3113502 A1 | 1/2017 |
| EP | 3393136 A1 | 10/2018 |

OTHER PUBLICATIONS

English translation of the Written Opinion of the International Search Authority in the international application No. PCT/CN2018/100713, dated Nov. 5, 2018.
Extended Search Report issued in European Application No. 18858973.3, dated Aug. 11, 2020.
Notice of Allowance of the Chinese application No. 201710861866.5, dated Dec. 7, 2021.

* cited by examiner

|  Bit Byte | 1 | 2 | 3 | 4 | 5 | 6 | 7 | 8 | | First sequence |
|---|---|---|---|---|---|---|---|---|---|---|
| 1 | 0 | 0 | 0 | 1 | 1 | 1 | 1 | 0 | → | 0 |
| 2 | 0 | 0 | 0 | 0 | 0 | 0 | 0 | 0 | → | 0 |
| 3 | 0 | 0 | 0 | 0 | 0 | 0 | 0 | 0 | → | 0 |
| 4 | 0 | 0 | 0 | 0 | 0 | 0 | 0 | 0 | → | 0 |
| 5 | 0 | 0 | 0 | 0 | 0 | 0 | 0 | 0 | → | 0 |
| 6 | 0 | 0 | 0 | 0 | 0 | 0 | 0 | 0 | → | 0 |
| 7 | 0 | 0 | 0 | 0 | 0 | 0 | 0 | 0 | → | 0 |
| 8 | 0 | 0 | 0 | 0 | 0 | 0 | 0 | 0 | → | 0 |

CHECK CODE PROCESSING METHOD, ELECTRONIC DEVICE AND STORAGE MEDIUM

CROSS-REFERENCE TO RELATED APPLICATION

This application is a National Stage of International Patent Application No. PCT/CN2018/100713, filed on Aug. 15, 2018, and claims priority to Chinese Patent Application No. 201710861866.5, filed on Sep. 21, 2017, the disclosures of which are hereby incorporated by reference in their entirety.

TECHNICAL FIELD

The disclosure relates, but not limited, to a synchronization technology in the field of communication, and particularly to a check code processing method, an electronic device and a storage medium.

BACKGROUND

In a data transmission process, check, for example, integrity check, over data is required. In the Ethernet, a receiver receives and then checks data, and it is found that a probability of indicating a check error after check is very high.

SUMMARY

In view of this, embodiments of the disclosure are intended to provide a check code processing method, an electronic device and a storage medium, to at least partially solve the technical problem.

The technical solutions of the disclosure are implemented as follows.

According to a first aspect, the embodiments of the disclosure provide a check code processing method, which may include the following operations.

m bits of an nth byte of a code block are operated to obtain an nth bit of a first sequence.

First sequences of code blocks in a same transmission cycle are operated to obtain a check code.

In some embodiments, when being applied to a sending device, the method may further include the following operation.

A check code of an nth transmission cycle is sent in a code block of an (n+m)th transmission cycle, both n and m being positive integers.

In some embodiments, the operation that the check code of the nth transmission cycle is sent in the code block of the (n+m)th transmission cycle may include at least one of the following operations.

The check code of the nth transmission cycle is sent in an idle block of the (n+m)th transmission cycle.

Or, the check code of the nth transmission cycle is sent in an Operation Administration and Maintenance (OAM) block replacing the idle block in the (n+m)th transmission cycle.

In some embodiments, the OAM block may include at least one of a first-type OAM block that is periodically sent or a second-type OAM block that is sent on demand.

The operation that the check code of the nth transmission cycle is sent in the OAM block replacing the idle block in the (n+m)th transmission cycle may include the following operation.

The check code of the nth transmission cycle is sent in the first-type OAM block replacing the idle block in the (n+m)th transmission cycle.

In some embodiments, the check code may be a Bit Interleaved Parity (BIP) check code.

In some embodiments, when being applied to a receiving device, the method may further include the following operations.

A check code sent in the (n+m)th transmission cycle is received, both n and m being positive integers.

The received check code is compared with a check code generated based on a code block of the nth transmission cycle.

Transmission quality of the code block of the nth transmission cycle is determined according to a comparison result.

A second aspect of the embodiments of the disclosure provides an electronic device, which may include a first operational unit and a second operational unit.

The first operational unit may be configured to operate m bits of an nth byte of a code block to obtain an nth bit of a first sequence.

The second operational unit may be configured to operate first sequences of code blocks in a same transmission cycle to obtain a check code.

In some embodiments, when the electronic device is a sending device, the electronic device may further include a sending unit.

The sending unit may be configured to send a check code of an nth transmission cycle in a code block of an (n+m)th transmission cycle, both n and m being positive integers.

Or,

When the electronic device is a receiving device, the electronic device may further include a receiving unit, a comparison unit and a determination unit.

The receiving unit may be configured to receive a check code sent in the (n+m)th transmission cycle, both n and m being positive integers.

The comparison unit may be configured to compare the received check code and a check code generated based on a code block of the nth transmission cycle.

The determination unit may be configured to determine transmission quality of the code block of the nth transmission cycle according to a comparison result.

A third aspect of the embodiments of the disclosure provides an electronic device, which may include a transceiver, a memory, a processor and computer programs stored in the memory and executed by the processor.

The processor may be connected with the memory and the transceiver respectively, and may be configured to execute the computer programs to implement the check code processing method provided in one or more abovementioned technical solutions.

A fourth aspect of the embodiments of the disclosure provides a computer storage medium, which may store computer programs, the computer programs being executed to implement the check code processing method provided in one or more abovementioned technical solutions.

According to the check code processing method, electronic device and storage medium provided in the embodiments of the disclosure, during check code calculation, operation is performed at first by use of bits in a byte of each code block to obtain a check bit, check bits respectively corresponding to each byte of the code block are integrated to obtain a first sequence, and then a first check bit of a code block in a transmission cycle is operated to obtain a check code.

In the first aspect, if check codes are generated in such a manner and first sequences are generated in such a manner, a first sequence generated based on an idle block is an all-zero check code. In such case, insertion or deletion of the idle block in a data stream may not influence generation of the check code, so that the problem that insertion or deletion of an idle block changes a check code to make check codes generated at a sender and a receiver different to further cause a check-code-based check failure or poor check-based signal transmission quality evaluation accuracy is solved, and a check success rate is increased or the check evaluation accuracy is improved.

In the second aspect, calculating the check code in such a manner may solve the problem that insertion or deletion of the idle block makes the check code calculated at the sender different from the check code received by the receiver. Moreover, such a check code may also be configured to check the idle block, and an error of the idle block in a transmission process may also be checked, so that the transmission quality check evaluation accuracy is further improved in this aspect.

BRIEF DESCRIPTION OF THE DRAWINGS

FIG. 2B is a schematic diagram of calculating a first sequence based on an idle block according to an embodiment of the disclosure.

DETAILED DESCRIPTION

The technical solutions of the disclosure will be further described below in combination with the drawings of the specification and specific embodiments in detail.

Figure 1:
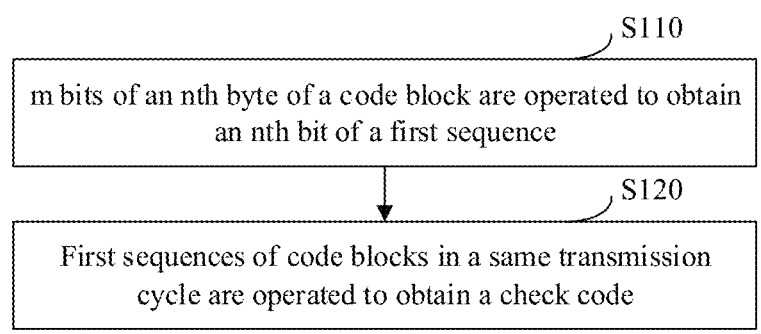
FIG. 1 is a flowchart of a check code processing method according to an embodiment of the disclosure.

It has been found by researches that, in the Ethernet, a sender and a receiver are not required to be completely synchronized. When a frequency of the sender is higher than a frequency of the receiver, data may be piled up. For avoiding overflow of the data that is piled up, an idle block in a data stream may be deleted and replaced with a data block carrying information to reduce pileup phenomena. When the frequency of the sender is lower than that of the receiver, an idle block may be added into the data stream, thereby avoiding an interrupt of the data stream. However, due to addition of the idle block, the data stream that is originally correctly transmitted may be checked to be wrong to cause the phenomenon that a probability of a check error is very high. In view of this, an embodiment of the disclosure provides a check code processing method. As shown in FIG. 1, the method includes the following operations.

In S110, m bits of an nth byte of a code block are operated to obtain an nth bit of a first sequence.

In S120, first sequences of code blocks in the same transmission cycle are operated to obtain a check code.

The check code processing method in the embodiment may be a method applied to a transmission device in the Ethernet (for example, Flexible Ethernet (FlexE), and the transmission device may be a sending device and may also be a receiving device.

In the embodiment, data in a data stream is transmitted by taking a code block as a unit. Code blocks in the data stream may include a starting block, an ending block, a data block, an idle block and the like. The starting block may be configured to identify a start of a transmission cycle. The ending block is configured to identify an end of the transmission cycle. The data block is a code block carrying a data content transmitted between a sender and a receiver. The idle block may be a code block carrying no information content involved in interaction between the sender and the receiver, and is configured to regulate transmission frequencies of the sender and the receiver.

A code block usually includes multiple bytes. For example, a 66 bit code block includes 2 fixed bits indicating a type of the code block and other 64 bits, and the 64 bits are divided into totally 8 bytes, each including 8 bits. In such case, a value of n is maximally 8.

In S110 in the embodiment, if the code block includes N bytes, the first sequence includes N bits, and generation of the nth bit in the first sequence is determined by the bits in the nth byte. For example, the nth bit of the first sequence is generated according to the nth byte.

In S110, logical operation such as exclusive or operation may be performed on the m bits in the nth byte to obtain one bit in the first sequence, and then m bits of each byte in the code block may be operated to obtain a bit of the first sequence. The m bits may be all bits or part of bits in the byte, and if being part of bits, they may be part of bits at predetermined positions.

In S120, logical operation such as exclusive or operation may be performed on first sequences obtained from all code blocks in the same transmission cycle to obtain the check code. Here, the check code may be a check code obtained based on all the code blocks in the same transmission cycle.

Figure 2A:
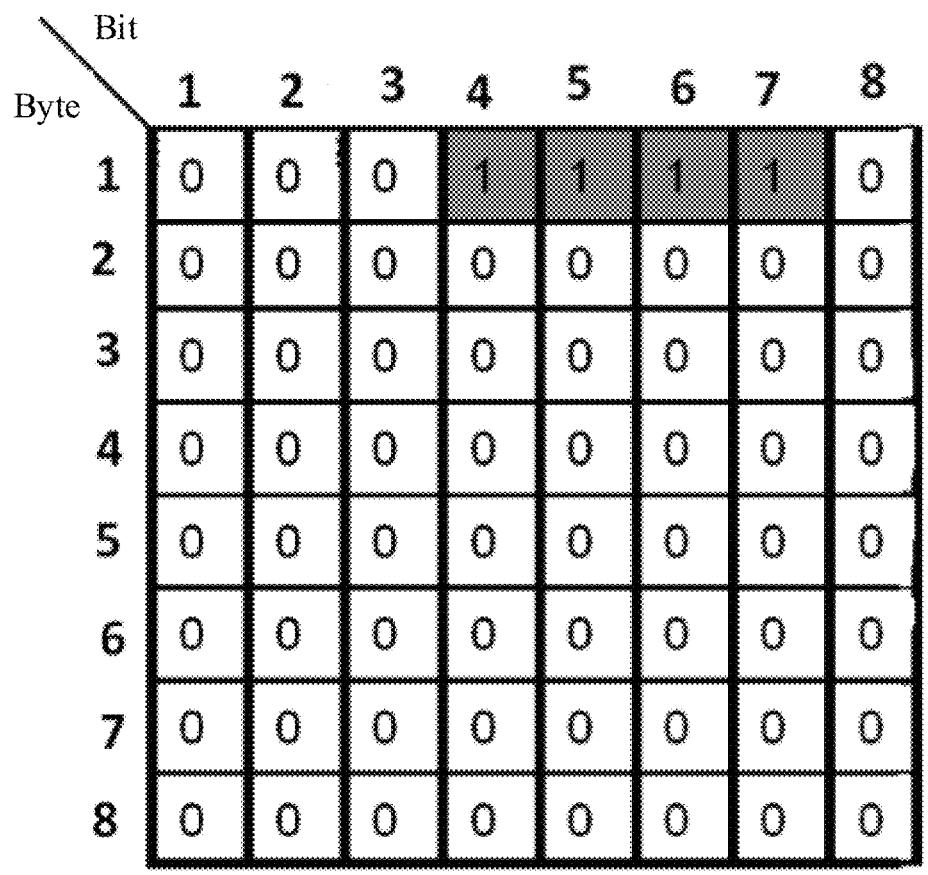
FIG. 2A is a structure diagram of an idle block according to an embodiment of the disclosure.

FIG. 2A is a schematic diagram of generating the first sequence based on the idle block. The vertical direction represents byte, and the lateral direction represents bit. It is apparent that an idle block includes 8 bytes and each byte includes 8 bits.

Exclusive or operation is performed on all the bits of the first byte of the idle block to generate a first bit of the first sequence, exclusive or operation is performed on all the bits of the second byte to generate a second bit of the first sequence ... the same operation is executed until exclusive or operation is performed on all the bits of the last byte of the idle block to obtain a last bit of the first sequence, and all the bits are combined to obtain the complete first sequence.

Then, exclusive or operation is performed bitwise on the first sequences obtained from all code blocks in the transmission cycle of the data stream including the idle block to obtain the check code. For example, exclusive or operation is performed on the yth bit of the first sequence generated based on the x1th code block and the yth bit of the first sequence generated based on the x2th code block, and when each of the first sequences corresponding to a respective one of all the code blocks in the transmission cycle are operated, the check code may be obtained.

FIG. 2B is a schematic diagram of a first sequence obtained based on exclusive or operation on a bit in each byte of an idle block. It is apparent that, in such a manner, all the bits in the first sequence obtained based on the idle block are zero.

In the embodiment, S110 may include the following operation.

Multiple said first sequences are calculated according to part or all of the code blocks in the transmission cycle.

For example, in some embodiments, the transmission cycle includes X code blocks, and in such case, S110 may include that the first sequences are calculated based on each code block in the X code blocks.

For another example, in some other embodiments, S110 may include that the first sequences are calculated based on part of code blocks. The part of code blocks may be code blocks of specified types. For example, the transmission cycle includes a check code block specially containing the check code. When the first sequences are calculated, the check code block may not participate in calculation of the first sequences, and all the other code blocks except the check code block participate in calculation of the first sequences. In the embodiment, the code block not participating in calculation of the first sequences may be a code block at a predetermined position in the transmission cycle, for example, a code block at a starting position or ending position of the transmission cycle. For example, if the check code is a BIP code, the check code block may be a BIP code block, and the BIP code block may be the first code block or last code block of the transmission cycle, so that code block calculation and check by the receiving device are facilitated.

Figure 3:
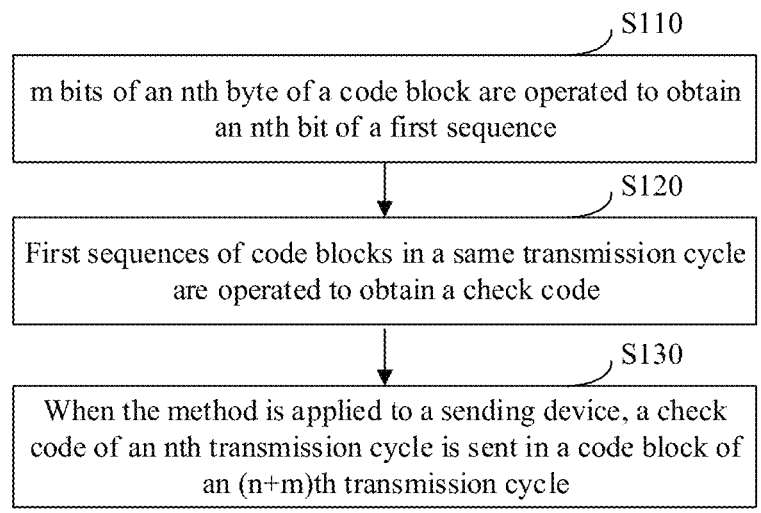
FIG. 3 is a flowchart of another check code processing method according to an embodiment of the disclosure.

In some embodiments, as shown in FIG. 3, the method further includes the following operation.

In S130, when the method is applied to a sending device, a check code of an nth transmission cycle is sent in a code block of an (n+m)th transmission cycle, both n and m being positive integers.

In some embodiments, if S110 to S120 are applied to the sending device and the present check code is generated based on a code block of the nth transmission cycle, the presently generated check code of the nth transmission cycle may be sent to the receiving device in the code block of the (n+m)th transmission cycle. Both n and m are positive integers.

In some embodiments, m may be valued to be 1, 2 or 3, etc.

In such case, there is a duration corresponding to m transmission cycles for the sending device to calculate the check code, so that a calculation capability requirement of the sending device is reduced, and a hardware requirement of the sending device is reduced.

In some embodiments, S130 may include the following operations.

The check code is sent in an idle block of the (n+m)th transmission cycle.

And/or, the check code is sent in an OAM block replacing the idle block in the (n+m)th transmission cycle.

The data stream contains multiple types of code blocks. In an embodiment, the check code may be transmitted in the idle block. The idle block is a code block originally inserted to coordinate inconsistent frequencies of the sending device and the receiving device. A bit, corresponding to an own code block type identifier, of the idle block is not zero, and all other bits are zero. In the embodiment, the idle block may be transformed into the check code block carrying the check code.

It is to be noted that, in the sending device, when the idle block is inserted into the data stream, no matter whether check code has been generated in the sending device or the receiving device or not, the check code may be inserted into the idle block, the generation of the check code of the sending device and the receiving device would not be influenced.

For different transmission speeds of different devices in a process of transmitting the data stream from the sending device to the receiving device, idle blocks may further be inserted and deleted. Since the check code is calculated by the method provided in the embodiment, an intermediate forwarding device inserts and deletes the idle block to solve the problem that the check codes finally obtained by the sending device and the receiving device are inconsistent under the circumstance that the other code blocks are correctly transmitted.

In some other embodiments, the sending device, before sending the data stream, may be required to insert the OAM block. The OAM block may be generated according to an OAM message. The OAM message is various information required to be transmitted in daily operation, administration and maintenance of an operating company over a network.

In some embodiments, for reducing increase of a data volume of the data stream due to insertion of the OAM block and avoiding occupation of more transmission resources, in the embodiment, the OAM block may usually be a code block replacing the idle block in the data stream. The OAM block contains the check code. Then, the sending device, when generating the OAM block, directly adds the check code into the OAM block, thereby sending both the OAM message and the check code through the OAM block. In such case, after the OAM block is sent to the receiving device, the receiving device may not be triggered to execute an OAM function indicated by the OAM message in the OAM block, and the check code may be extracted to check transmission of the code block of the nth transmission cycle, thereby evaluating transmission quality.

In some embodiments, the OAM block includes a first-type OAM block that is periodically sent and/or a second-type OAM block that is sent on demand.

S130 may include the following operation.

The check code is sent in the first-type OAM block replacing the idle block in the (n+m)th transmission cycle.

In the embodiment, OAM blocks are divided into two types, one type being periodically sent and the other type being sent on demand. The OAM block that is sent on demand is highly random. For the OAM block that is periodically sent, the OAM block may be sent according to a period of the OAM message. The check code is a check code for the code block of each transmission cycle in the data stream and is required to be periodically transmitted. Therefore, transmitting the check code in the first-type OAM block may implement periodic transmission of the check code with a higher probability.

In some embodiments, the first-type OAM block is an OAM block generated based on daily periodic maintenance, and the second-type OAM block is an OAM block generated based on a triggering event or an OAM block generated based on an instruction.

For example, the first-type OAM block includes at least one of a connectivity check block, a signal quality check block, a local client signal failure indication block, a remote client signal failure indication block, a client signal power consumption indication block, a remote defect indication block and a remote error indication block.

The connectivity check block is configured to trigger the receiver and/or the sender to execute connectivity check of a transmission link.

The signal quality check block is configured to trigger the receiver and/or the sender to execute check of signal quality, for example, check of a bit error rate and/or a code error rate.

A client signal type indication block is configured to indicate a type of a client signal that is presently transmitted.

A connectivity verification block is configured to indicate a code block checking connectivity of the transmission link.

A one-way delay measurement block is configured to indicate a code block executing delay measurement of a one-way link from the sender to the receiver or from the receiver to the sender.

A two-way delay measurement block is configured to indicate a code block of the sender for triggering delay measurement of a two-way link. The two-way link includes a transmission link from the sender to the receiver and then from the receiver to the sender.

A two-way delay measurement response block is configured to indicate a code block of the receiver for responding to delay measurement of the two-way link.

In some embodiments, the OAM block is divided into a unifunctional OAM block and a multifunctional OAM block according to an OAM function triggered to be executed. The multifunctional OAM block contains multiple fields, and these fields carry fields configured to trigger different OAM functions to be executed. For example, the fields may include at least one of an automatic protection switching field, a client signal type indication field, a connectivity verification field, a one-way delay measurement field, a two-way delay measurement field and a two-way delay measurement response block.

In some embodiments, the check code is a BIP check code.

If the code block in the data stream is a 64 Bit/66 Bit Block (64 B/66 B Block), the BIP check code is a check code including 8 bits, and may also be called BIP8.

Figure 4:
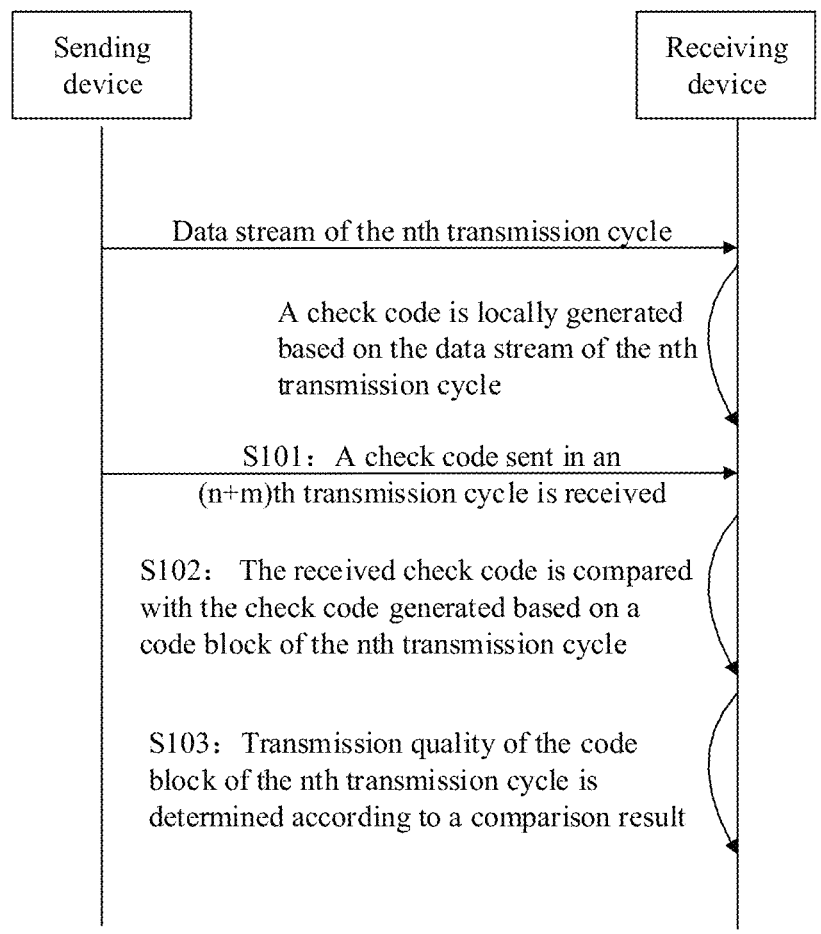
FIG. 4 is a flowchart of another check code processing method according to an embodiment of the disclosure.

In some embodiments, as shown in FIG. 4, when being applied to the receiving device, the method further includes the following operations.

In S101, a check code sent in the (n+m)th transmission cycle is received, both n and m being positive integers.

In S102, the received check code is compared with the check code generated based on a code block of the nth transmission cycle.

In S103, transmission quality of the code block of the nth transmission cycle is determined according to a comparison result.

In the embodiment, the receiving device may receive the check code in the code block transmitted in the (n+m)th transmission cycle. For example, the check code is extracted from the idle block or OAM block of the (n+m)th transmission cycle. Here, the received check code is generated by the sending device.

The receiving device may locally execute S110 to S120 to locally generate the check code based on the code block of the nth transmission cycle.

Figure 5:
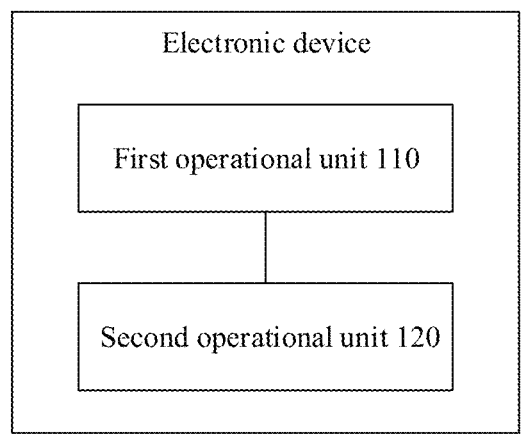
FIG. 5 is a structure diagram of an electronic device according to an embodiment of the disclosure.

As shown in FIG. 5, an embodiment also provides an electronic device, which includes a first operational unit 110 and a second operational unit 120.

The first operational unit 110 is configured to operate m bits of an nth byte of a code block to obtain an nth bit of a first sequence.

The second operational unit 120 is configured to operate first sequences of code blocks in the same transmission cycle to obtain a check code.

In the embodiment, the first operational unit 110 and the second operational unit 120 may correspond to an operational circuit or a processor, and the operational circuit may include a logical operational circuit.

The first operational unit 110 may be configured to calculate the first sequence. The second operational unit 120 may be configured to generate the check code.

Operation may be any logical operation, for example, or, and, and exclusive or logical operation and so on.

In such case, each bit in the first sequence is only determined by all or part of bits in a certain byte of the code block and is not a value of a bit at a corresponding position between two bytes, so that the problem that insertion or deletion of an idle block in a data stream changes a check code that is finally calculated may be solved. Therefore, the problem of check failure or high error rate caused by insertion or deletion of the idle block is solved; and moreover, the check code may also be configured to check the idle block, and a transmission error of the idle block may also be checked, so that transmission quality, for example, accuracy like a code error rate or a bit error rate, is further improved.

In the embodiment, the check code may be, but not limited to, a BIP code.

In some embodiments, when the electronic device is a sending device, the electronic device further includes a sending unit.

The sending unit is configured to send a check code of an nth transmission cycle in a code block of an (n+m)th transmission cycle, both n and m being positive integers.

The sending unit may correspond to a sending interface. The sending interface may be an Ethernet interface or a FlexEthernet interface, and may be configured for the sending device to send the check code to the receiving device in the next mth transmission cycles. The sending device may be a source-end device of the data stream, may also be a transmission device receiving the data stream from the source-end device and forwarding it to a target device, and is not limited to the source-end device.

In some embodiments, the sending unit is configured to send the check code in an idle block of the (n+m)th transmission cycle and/or send the check code in an OAM block replacing the idle block in the (n+m)th transmission cycle.

In some embodiments, the OAM block includes a first-type OAM block that is periodically sent and/or a second-type OAM block that is sent on demand; and the sending unit is configured to send the check code in the first-type OAM block replacing the idle block in the (n+m)th transmission cycle.

In some embodiments, when the electronic device is a receiving device, the electronic device further includes a receiving unit, a comparison unit and a determination unit.

The receiving unit is configured to receive a check code sent in the (n+m)th transmission cycle, both n and m being positive integers.

The comparison unit is configured to compare the received check code and the check code generated based on a code block of the nth transmission cycle.

The determination unit is configured to determine transmission quality of the code block of the nth transmission cycle according to a comparison result.

In the embodiment, if being the receiving device, the electronic device may be provided with the receiving unit, and the receiving unit may correspond to a receiving interface, and may be configured to receive the check code transmitted in the (n+m)th transmission cycle. Based on the check code calculated by the electronic device, the two check codes may be compared to obtain the comparison result, and the transmission quality of the nth transmission cycle may further be evaluated according to the comparison result. The transmission quality may be reflected as a parameter such as the code error rate, a code block error rate or the bit error rate.

Figure 6:
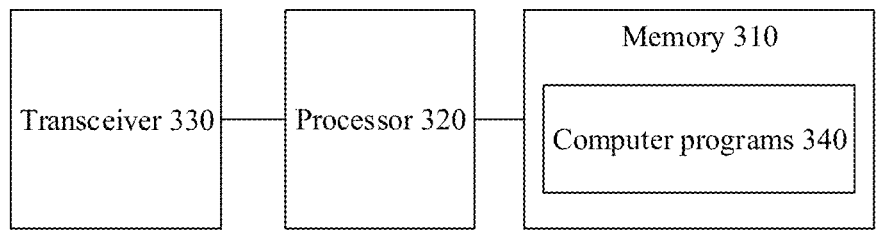
FIG. 6 is a structure diagram of another electronic device according to an embodiment of the disclosure.

An embodiment also provides an electronic device, which may be the abovementioned sending device or receiving device. As shown in FIG. 6, the electronic device may include:

a transceiver 330, a memory 310, a processor 320 and computer programs 340 stored in the memory 310 and run by the processor 320.

The processor 320 is connected with the memory 310 and the transceiver 330 respectively, and is configured to execute the computer programs to execute the check code processing method provided in any one or more technical solutions, for example, executing one or more of the methods shown in FIG. 1, FIG. 3 and FIG. 4.

In the embodiment, the transceiver 330 may correspond to a transceiver antenna, and the transceiver antenna may be configured for information interaction between a base station and UE.

The memory 310 may include various types of storage media, and may be configured for data storage. In the embodiment, at least part of storage media in the memory 310 are nonvolatile storage media and may be configured to store the computer program 340.

The processor 320 may include a central processing unit, a microprocessor, a digital signal processor, an application processor, an application-specific integrated circuit or a programmable array, etc. and may be configured to execute the computer programs 340 to determine cell signal quality.

In the embodiment, the processor 320 may be connected with the transceiver 330 and the memory 310 through an in-device bus such as an integrated circuit bus.

An embodiment of the disclosure also provides a computer storage medium, which stores computer programs, the computer programs being executed by a processor to execute the check code processing method provided in one or more abovementioned technical solutions, for example, executing one or more of the methods shown in FIG. 1, FIG. 3 and FIG. 4.

The computer storage medium provided in the embodiment of the disclosure includes: various media capable of storing program codes such as a mobile storage device, a Read-Only Memory (ROM), a Random Access Memory (RAM), a magnetic disk or a compact disc. Optionally, the computer storage medium may be a non-transitory storage medium. Here, the non-transitory storage medium may also be called a nonvolatile storage medium.

Specific examples will be provided below in combination with any abovementioned technical solution.

EXAMPLE 1

The example provides a BIP8 code calculation method. For example, each code block includes 64/66 bits, and 64 bits in 66 bits participate in calculation. Each 64 bit code block actually consists of 8 bytes. Unlike a vertical calculation manner of executing exclusive or operation bitwise on bits at the same positions in different bytes, exclusive or operation is performed bitwise on different bits of the same byte to obtain a BIP code in the example.

For example, an idle block is valued to be 2b'00000000 in such a calculation manner. In such a calculation manner, addition and deletion of an idle frame may not influence BIP check of a receiver.

A calculation process for N continuous checked code blocks is as follows.

In a first operation, a BIP8 content of each code block is calculated, exclusive or operation is performed bitwise on 8 bits of a seventh byte in a code block to obtain a BIP[7] content, exclusive or operation is performed bitwise on 8 bits of a sixth byte in the code block to obtain a BIP[6] content, and exclusive or operation is performed on bits of other bytes in the same manner until exclusive or operation is performed bitwise on 8 bits of a 0th byte in the code block to obtain a BIP[0] content.

In a second operation, exclusive or operation is performed bitwise on the BIP information values calculated from all code blocks to obtain a final BIP8 value.

During BIP8 calculation of a (64 B/66 B Block) stream, if BIP8 of an idle code block is calculated to be 0 by a related algorithm, influence of BIP check of the idle code block in a transmission process may be eliminated.

A vertical calculation manner is replaced with lateral calculation. A BIP8 content of each code block is calculated, exclusive or operation is performed bitwise on 8 bits of a seventh byte in a code block to obtain a BIP[7] content, exclusive or operation is performed bitwise on 8 bits of a sixth byte in the code block to obtain a BIP[6] content, and exclusive or operation is performed on bits of other bytes in the same manner until exclusive or operation is performed bitwise on 8 bits of a 0th byte in the code block to obtain a BIP[0] content.

For N continuous checked code blocks, the lateral calculation manner is adopted for calculation, and exclusive or operation is performed bitwise on calculated BIP information values of all the code blocks to obtain a final BIP8 value.

Figure 7:
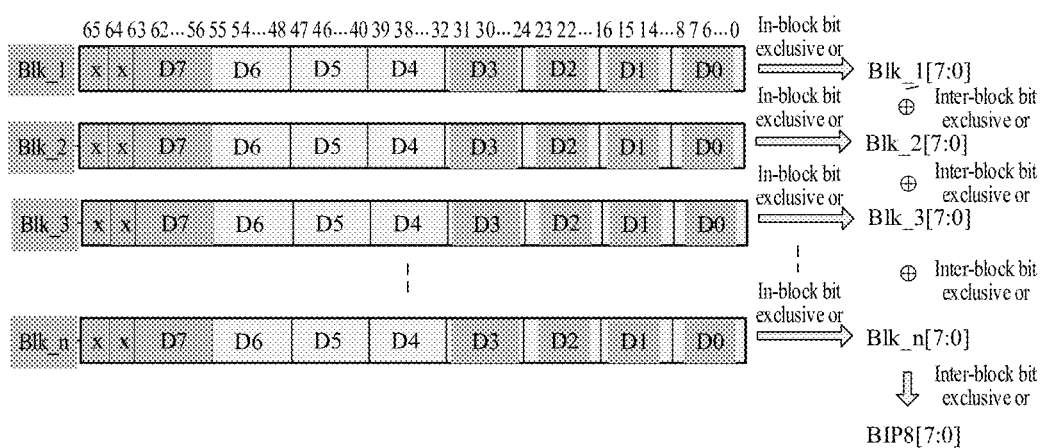
FIG. 7 is a flowchart of generating a BIP code according to an embodiment of the disclosure.

As shown in FIG. 7, a transmission cycle may include multiple blocks, and n blocks are presented in FIG. 7, i.e., Blk-1 to Blk-n respectively. In-block exclusive or operation is performed at first to obtain Blk-1[7:0] to Blk-n[7:0], namely exclusive or operation is performed on bits in each byte in a block to obtain an 8 bit first sequence.

Then, inter-block exclusive or operation is performed, thereby obtaining BIP8[7:0] in the transmission cycle based on Blk-1[7:0] to Blk-n[7:0].

By such a mechanism, the problem of influence of addition and deletion of an idle code block on a BIP check mechanism in the transmission process is solved, and a basic calculation method and implementation mechanism are provided for 64 B/66 B code stream-based BIP calculation.

EXAMPLE 3

The example provides some optional methods for generation and transmission of a check code.

A First Optional Manner

Figure 8A:
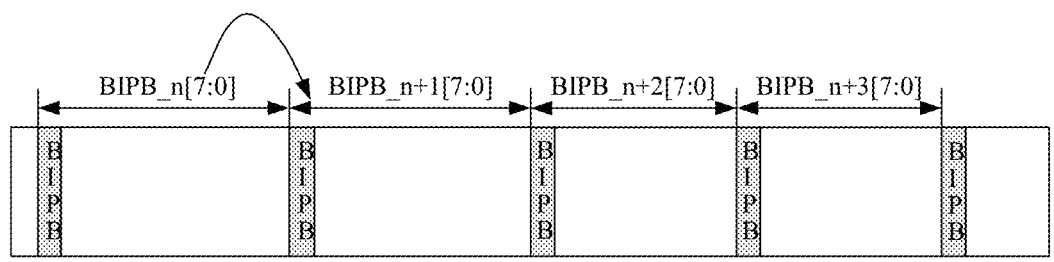
FIG. 8A is a schematic diagram of generating and transmitting a BIP code according to an embodiment of the disclosure.

As shown in FIG. 8A, the method includes the following operations.

Y first sequences are calculated according to all code blocks (for example, Y code blocks are included) in an nth transmission cycle respectively, Y being a positive integer. A manner for calculating the first sequence may refer to the abovementioned embodiments.

Exclusive or operation is performed on the Y first sequences to generate a BIP code.

The BIP code is sent in an (n+1)th transmission cycle. For example, as shown in FIG. 8A, the BIP code is transmitted in a first code block of the (n+1)th transmission cycle. In FIG. 8A, the code block carrying the BIP code is called BIPB. In FIG. 8A, the code blocks covered by the straight double sided arrows are code blocks participating in BIP calculation. It is apparent that, in the manner shown in FIG. 8A, all the code blocks of the transmission cycle participate in BIP calculation. In FIG. 8A, the cycle that the crooked arrow points to refers to a corresponding relationship between a transmission cycle where the BIP code is generated and a transmission cycle where the BIP code is transmitted, so that it may be obtained that the BIP code of the nth transmission cycle is transmitted in the first code block of the (n+1)th transmission cycle.

A Second Optional Manner

Figure 8B:
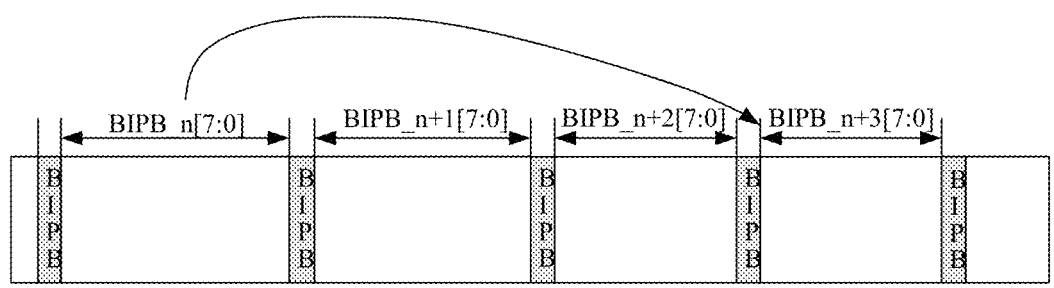
FIG. 8B is another schematic diagram of generating and transmitting a BIP code according to an embodiment of the disclosure.

As shown in FIG. 8B, the method includes the following operations.

y first sequences are calculated according to the code blocks, except a check code block, in the nth transmission cycle respectively, y being less than Y and y being a positive integer.

Exclusive or operation is performed on the y first sequences to generate a BIP code.

The BIP code is sent in an (n+m)th transmission cycle. For example, the BIP code is sent in the (n+1)th or (n+2)th transmission cycle. In the example, the code blocks participating in BIP calculation do not include the check code block.

Similarly, the code block transmitting the BIP code in FIG. 8B is called BIPB. It is apparent that, in the example, BIPB does not participate in BIP calculation, and the BIP code of the nth transmission cycle is transmitted in BIPB of the (n+2)th transmission cycle.

A Third Optional Manner

Figure 8C:
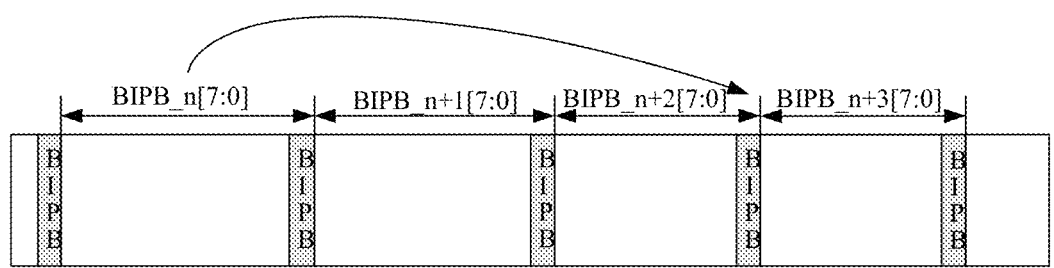
FIG. 8C is another schematic diagram of generating and transmitting a BIP code according to an embodiment of the disclosure.

As shown in FIG. 8C, the method includes the following operations.

Y first sequences are calculated according to all code blocks (for example, Y code blocks are included) in the nth transmission cycle respectively, Y being a positive integer. A manner for calculating the first sequence may refer to the abovementioned embodiments.

The BIP code is sent in the (n+2)th transmission cycle. In FIG. 8C, all the code blocks in the transmission cycle participate in BIP calculation, and the BIP code generated based on the code blocks of the nth transmission cycle is transmitted in BIPB of the (n+2)th transmission cycle.

In some embodiments provided by the application, it is to be understood that the disclosed device and method may be implemented in another manner. The device embodiment described above is only schematic, and for example, division of the units is only logic function division, and other division manners may be adopted during practical implementation. For example, multiple units or components may be combined or integrated into another system, or some characteristics may be neglected or not executed. In addition, coupling or direct coupling or communication connection between each displayed or discussed component may be indirect coupling or communication connection, implemented through some interfaces, of the device or the units, and may be electrical and mechanical or adopt other forms.

The units described as separate parts may or may not be physically separated, and parts displayed as units may or may not be physical units, and namely may be located in the same place, or may also be distributed to multiple network units. Part of all of the units may be selected according to a practical requirement to achieve the purposes of the solutions of the embodiments.

In addition, each functional unit in each embodiment of the disclosure may be integrated into a processing module, each unit may also serve as an independent unit and two or more than two units may also be integrated into a unit. The integrated unit may be implemented in a hardware form and may also be implemented in form of hardware and software functional unit.

Those of ordinary skill in the art should know that all or part of the operations of the method embodiment may be implemented by related hardware instructed through a program, the program may be stored in a computer-readable storage medium, and the program is executed to execute the operations of the method embodiment. The storage medium includes: various media capable of storing program codes such as a mobile storage device, a ROM, a RAM, a magnetic disk or a compact disc.

The above is only the specific implementation mode of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

The invention claimed is:

1. A method implemented for each transmission cycle for check code processing for synchronization of check codes generated at a sending device and a receiving device in an Ethernet, performed by a transmission device, comprising:
    for each 64 Bit/66 Bit (64 B/66 B) block in a same transmission cycle, and for each $k \in \{0, 1, 2, 3, 4, 5, 6$ and $7\}$,
    performing in-block exclusive or operation bitwise on 8 bits of a kth byte of the 64 B/66B block to obtain a $k^{th}$ bit of an 8-bit first sequence corresponding to the 64 B/66 B block, thereby obtaining an 8-bit first sequence for each 64 B/66 B block in the same transmission cycle; and
    performing inter-block exclusive or operation bitwise on all obtained 8-bit first sequences of the 64 B/66 B blocks in the same transmission cycle to obtain a check code, wherein the obtained check code is used for checking data during a data transmission process in the Ethernet.

2. The method of claim 1, wherein
when the transmission device is the sending device, the method further comprises:
    sending a check code of an nth transmission cycle in a 64 B/66 B block of an (n+m)th transmission cycle, both n and m being positive integers.

3. The method of claim 2, wherein
sending the check code of the nth transmission cycle in the 64 B/66 B block of the (n+m)th transmission cycle comprises at least one of the following:
    sending the check code of the nth transmission cycle in an idle block of the (n+m)th transmission cycle;
    or, sending the check code of the nth transmission cycle in an Operation Administration and Maintenance (OAM) block replacing the idle block in the (n+m)th transmission cycle.

4. The method of claim 3, wherein
the OAM block comprises at least one of a first-type OAM block that is periodically sent or a second-type OAM block that is sent on demand; and
sending the check code of the nth transmission cycle in the OAM block replacing the idle block in the (n+m)th transmission cycle comprises:
sending the check code of the nth transmission cycle in the first-type OAM block replacing the idle block in the (n+m)th transmission cycle.

5. The method of claim 1, wherein
the check code is a Bit Interleaved Parity (BIP) check code.

6. The method of claim 1, wherein
when the transmission device is the receiving device, the method further comprises:
receiving a check code sent in the (n+m)th transmission cycle, both n and m being positive integers;
comparing the received check code and a check code generated based on the 64 B/66 B block of an nth transmission cycle; and
determining transmission quality of the 64 B/66 B block of the nth transmission cycle according to a comparison result.

7. An electronic device, comprising a transceiver, a memory, and a processor, wherein the processor is connected with the memory and the transceiver respectively, and is configured to execute computer programs stored in the memory to implement a method implemented for each transmission cycle for check code processing for synchronization of check codes generated at a sending device and a receiving device in an Ethernet, wherein the method comprises:
for each 64 Bit/66 Bit (64 B/66 B) block in a same transmission cycle, and for each k∈{0, 1, 2, 3, 4, 5, 6 and 7},
performing in-block exclusive or operation bitwise on 8 bits of a kth byte of the 64 B/66 B block to obtain a $k^{th}$ bit of an 8-bit first sequence corresponding to the 64 B/66 B block, thereby obtaining an 8-bit first sequence for each 64 B/66 B block in the same transmission cycle; and
performing inter-block exclusive or operation bitwise on all obtained 8-bit first sequences of the 64 B/66 B blocks in the same transmission cycle to obtain a check code, wherein the obtained check code is used for checking data during a data transmission process in the Ethernet.

8. The electronic device of claim 7, wherein when the electronic device is the sending device, the method further comprises:
sending a check code of an nth transmission cycle in a 64 B/66 B block of an (n+m)th transmission cycle, both n and m being positive integers.

9. The electronic device of claim 7, wherein,
when the electronic device is the receiving device, the method further comprises:
receiving a check code sent in the (n+m)th transmission cycle, both n and m being positive integers;
comparing the received check code and a check code generated based on the 64 B/66 B block of an nth transmission cycle; and
determining transmission quality of the code block of the nth transmission cycle according to a comparison result.

10. A non-transitory computer storage medium, storing computer programs, the computer programs being executed to implement a method implemented for each transmission cycle for check code processing for synchronization of check codes generated at a sending device and a receiving device in an Ethernet, wherein the method comprises:
for each 64 Bit/66 Bit (64 B/66 B) block in a same transmission cycle, and for each k∈{0, 1, 2, 3, 4, 5, 6 and 7},
performing in-block exclusive or operation bitwise on 8 bits of a kth byte of the 64 B/66 B block to obtain a $k^{th}$ bit of an 8-bit first sequence corresponding to the 64 B/66 B block, thereby obtaining an 8-bit first sequence for each 64 B/66 B block in the same transmission cycle; and
performing inter-block exclusive or operation bitwise on all obtained 8-bit first sequences of the 64 B/66 B blocks in the same transmission cycle to obtain a check code, wherein the obtained check code is used for checking data during a data transmission process in the Ethernet.

11. The non-transitory computer storage medium of claim 10, wherein
when the computer programs are executed by the sending device, the method further comprises:
sending a check code of an nth transmission cycle in a 64 B/66 B block of an (n+m)th transmission cycle, both n and m being positive integers.

12. The non-transitory computer storage medium of claim 11, wherein
sending the check code of the nth transmission cycle in the 64 B/66 B block of the (n+m)th transmission cycle comprises at least one of the following:
sending the check code of the nth transmission cycle in an idle block of the (n+m)th transmission cycle;
or,
sending the check code of the nth transmission cycle in an Operation Administration and Maintenance (OAM) block replacing the idle block in the (n+m)th transmission cycle.

13. The non-transitory computer storage medium of claim 12, wherein
the OAM block comprises at least one of a first-type OAM block that is periodically sent or a second-type OAM block that is sent on demand; and
sending the check code of the nth transmission cycle in the OAM block replacing the idle block in the (n+m)th transmission cycle comprises:
sending the check code of the nth transmission cycle in the first-type OAM block replacing the idle block in the (n+m)th transmission cycle.

14. The non-transitory computer storage medium of claim 10, wherein the check code is a Bit Interleaved Parity (BIP) check code.

15. The non-transitory computer storage medium of claim 10, wherein
when the computer programs are executed by the receiving device, the method further comprises:
receiving a check code sent in the (n+m)th transmission cycle, both n and m being positive integers;
comparing the received check code and a check code generated based on the 64 B/66 B block of an nth transmission cycle; and determining transmission quality of the 64 B/66 B block of the nth transmission cycle according to a comparison result.

16. The electronic device of claim 8, wherein
sending the check code of the nth transmission cycle in the 64 B/66 B block of the (n+m)th transmission cycle comprises at least one of the following:
sending the check code of the nth transmission cycle in an idle block of the (n+m)th transmission cycle;
or,
sending the check code of the nth transmission cycle in an Operation Administration and Maintenance (OAM) block replacing the idle block in the (n+m)th transmission cycle.

17. The electronic device of claim 16, wherein
the OAM block comprises at least one of a first-type OAM block that is periodically sent or a second-type OAM block that is sent on demand; and
sending the check code of the nth transmission cycle in the OAM block replacing the idle block in the (n+m)th transmission cycle comprises:
sending the check code of the nth transmission cycle in the first-type OAM block replacing the idle block in the (n+m)th transmission cycle.

18. The electronic device of claim 7, wherein the check code is a Bit Interleaved Parity (BIP) check code.

19. The method of claim 1, wherein for each 64 Bit/66 Bit (64 B/66 B) Block in a same transmission cycle, and for each $\in\{0, 1, 2, 3, 4, 5, 6$ and $7\}$, performing in-block exclusive or operation bitwise on 8 bits of the kth byte of the 64 B/66 B block to obtain a $k^{th}$ bit of an 8-bit first sequence corresponding to the 64 B/66 B Block, thereby obtaining an 8-bit first sequence for each 64 B/66 B Block in the same transmission cycle comprises:
performing exclusive or operation bitwise on 8 bits of a zeroth byte in the 64 B/66 B Block to obtain a zeroth bit of the first sequence;
performing exclusive or operation bitwise on 8 bits of a first byte in the 64 B/66 B Block to obtain a first bit of the first sequence;
performing exclusive or operation bitwise on 8 bits of a second byte in the 64 B/66 B Block to obtain a second bit of the first sequence;
performing exclusive or operation bitwise on 8 bits of a third byte in the 64 B/66 B Block to obtain a third bit of the first sequence;
performing exclusive or operation bitwise on 8 bits of a forth byte in the 64 B/66 B Block to obtain a forth bit of the first sequence;
performing exclusive or operation bitwise on 8 bits of a fifth byte in the 64 B/66 B Block to obtain a fifth bit of the first sequence;
performing exclusive or operation bitwise on 8 bits of a sixth byte in the 64 B/66 B Block to obtain a sixth bit of the first sequence;
performing exclusive or operation bitwise on 8 bits of a seventh byte in the 64 B/66 B Block to obtain a seventh bit of the first sequence; and
wherein performing inter-block exclusive or operation bitwise on all obtained 8-bit first sequences of the 64 B/66 B blocks in the same transmission cycle to obtain a check code comprising:
performing exclusive or operation bitwise on the first sequences calculated from all 64 B/66 B blocks in the same transmission cycle to obtain a check code.

20. The electronic device of claim 7, wherein for each 64 Bit/66 Bit (64 B/66 B) Block in a same transmission cycle, and for each $\in\{0, 1, 2, 3, 4, 5, 6$ and $7\}$, performing in-block exclusive or operation bitwise on 8 bits of the kth byte of the 64 B/66 B block to obtain a $k^{th}$ bit of an 8-bit first sequence corresponding to the 64 B/66 B Block, thereby obtaining an 8-bit first sequence for each 64 B/66 B Block in the same transmission cycle comprises:
performing exclusive or operation bitwise on 8 bits of a zeroth byte in the 64 B/66 B Block to obtain a zeroth bit of the first sequence;
performing exclusive or operation bitwise on 8 bits of a first byte in the 64 B/66 B Block to obtain a first bit of the first sequence;
performing exclusive or operation bitwise on 8 bits of a second byte in the 64 B/66 B Block to obtain a second bit of the first sequence;
performing exclusive or operation bitwise on 8 bits of a third byte in the 64 B/66 B Block to obtain a third bit of the first sequence;
performing exclusive or operation bitwise on 8 bits of a forth byte in the 64 B/66 B Block to obtain a forth bit of the first sequence;
performing exclusive or operation bitwise on 8 bits of a fifth byte in the 64 B/66 B Block to obtain a fifth bit of the first sequence;
performing exclusive or operation bitwise on 8 bits of a sixth byte in the 64 B/66 B Block to obtain a sixth bit of the first sequence;
performing exclusive or operation bitwise on 8 bits of a seventh byte in the 64 B/66 B Block to obtain a seventh bit of the first sequence; and
wherein performing inter-block exclusive or operation bitwise on all obtained 8-bit first sequences of the 64 B/66 B blocks in the same transmission cycle to obtain a check code comprising:
performing exclusive or operation bitwise on the first sequences calculated from all 64 B/66 B blocks in the same transmission cycle to obtain a check code.

* * * * *